US012677485B2

(12) United States Patent　　　(10) Patent No.: US 12,677,485 B2
Mei et al.　　　　　　　　　　　　(45) Date of Patent: Jul. 7, 2026

(54) DIELECTRIC LAYER RESPONSE-BASED FIELD EFFECT TRANSISTOR PHOTODETECTOR

(71) Applicant: HUAZHONG UNIVERSITY OF SCIENCE AND TECHNOLOGY, Hubei (CN)

(72) Inventors: Anyi Mei, Hubei (CN); Hongwei Han, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 391 days.

(21) Appl. No.: 18/266,809

(22) PCT Filed: Dec. 3, 2021

(86) PCT No.: PCT/CN2021/135265
§ 371 (c)(1),
(2) Date: Jun. 13, 2023

(87) PCT Pub. No.: WO2022/151862
PCT Pub. Date: Jul. 21, 2022

(65) Prior Publication Data
US 2024/0304743 A1　　Sep. 12, 2024

(30) Foreign Application Priority Data
Jan. 18, 2021　(CN) ......................... 202110062343.0

(51) Int. Cl.
*H10F 30/282*　　(2025.01)
*H10K 30/65*　　(2023.01)
(52) U.S. Cl.
CPC ........... *H10F 30/282* (2025.01); *H10K 30/65* (2023.02)

(58) Field of Classification Search
CPC .... H10F 30/282; H10F 30/28; H10F 77/1246; H10F 77/331; H10F 30/21; H10K 30/65; H10K 10/468; Y02E 10/549; Y02P 70/50
See application file for complete search history.

(56) References Cited

U.S. PATENT DOCUMENTS

| | | | |
|---|---|---|---|
| 5,686,734 A * | 11/1997 | Hamakawa | H10F 77/1665 257/E31.049 |
| 6,772,992 B1 * | 8/2004 | Lombardo | H10D 30/69 251/71 |

(Continued)

FOREIGN PATENT DOCUMENTS

| | | |
|---|---|---|
| CN | 101807547 | 8/2010 |
| CN | 105895729 | 8/2016 |

(Continued)

OTHER PUBLICATIONS

"International Search Report (Form PCT/ISA/210) of PCT/CN2021/135265," mailed on Feb. 23, 2022, with English translation thereof, pp. 1-5.

(Continued)

*Primary Examiner* — Bitew A Dinke
(74) *Attorney, Agent, or Firm* — JCIPRNET

(57) ABSTRACT
This disclosure relates to a dielectric layer response-based field effect transistor photodetector, comprising a gate, a photoelectric response composite dielectric layer, a carrier transport layer, a source, and a drain. The composite dielectric layer is formed by compounding a photoelectric response dielectric and a charge blocking insulating dielectric; the carrier transport layer is used for transporting electrons or holes, the photoelectric response dielectric is used for absorbing light under illumination to generate electrons, holes or excitons, and the charge blocking insulating dielectric is used for limiting passage of the electrons, holes or excitons. The generation of photogenerated elec- (Continued)

trons, holes or excitons in the composite dielectric layer and the movement of the photogenerated electrons, holes or excitons limited within the photoelectric response dielectric cause the equivalent permittivity of the composite dielectric layer to change, causing changes in carrier concentration and conductivity of the carrier transport layer and achieving photoelectric detection.

20 Claims, 5 Drawing Sheets

(56)                 References Cited

U.S. PATENT DOCUMENTS

| 7,148,417 B1 * | 12/2006 | Landis | H10F 10/161 |
| | | | 257/E31.022 |
| 2006/0118795 A1 * | 6/2006 | Araki | H10F 39/809 |
| | | | 257/83 |
| 2008/0035965 A1 * | 2/2008 | Hayashi | H10F 39/1825 |
| | | | 257/440 |
| 2009/0267060 A1 * | 10/2009 | Forrest | H10K 30/211 |
| | | | 257/40 |
| 2010/0319764 A1 * | 12/2010 | Wiemer | H10F 77/12485 |
| | | | 438/93 |
| 2011/0001221 A1 | 1/2011 | Lin et al. | |
| 2011/0215227 A1 * | 9/2011 | Yan | H10F 39/18 |
| | | | 257/E31.073 |
| 2018/0269235 A1 * | 9/2018 | Kim | H10K 85/50 |
| 2019/0006541 A1 * | 1/2019 | So | H10K 30/353 |
| 2020/0131202 A1 * | 4/2020 | Obana | C07F 5/02 |
| 2020/0313089 A1 * | 10/2020 | Chen | H10F 71/125 |
| 2021/0343891 A1 * | 11/2021 | Leem | H10F 77/413 |

FOREIGN PATENT DOCUMENTS

| CN | 108899378 | 11/2018 | |
| CN | 109326722 | 2/2019 | |
| CN | 110073207 | 7/2019 | |
| CN | 112909116 | 6/2021 | |
| WO | WO-2016136729 A1 * | 9/2016 | H10K 30/80 |

OTHER PUBLICATIONS

"Written Opinion of the International Searching Authority (Form PCT/ISA/237) of PCT/CN2021/135265," mailed on Feb. 23, 2022, pp. 1-5.

* cited by examiner

DIELECTRIC LAYER RESPONSE-BASED FIELD EFFECT TRANSISTOR PHOTODETECTOR

CROSS-REFERENCE TO RELATED APPLICATION

This application is a 371 of international application of PCT application serial no. PCT/CN2021/135265, filed on Dec. 3, 2021, which claims the priority benefit of China application no. 202110062343.0, filed on Jan. 18, 2021. The entirety of each of the above mentioned patent applications is hereby incorporated by reference herein and made a part of this specification.

BACKGROUND

Technical Field

The invention relates to the field of photodetectors, and in particular, involves a dielectric layer response-based field effect transistor photodetector.

Description of Related Art

Optical signals contain a lot of useful information, and effective detection of photons helps to obtain these pieces of information, so as to collect and transmit information. The effective detection of photons is of great significance to the development of informatization and intelligent technology. Photon detection technology is mainly based on photodetectors. That is, through device design, an optical signal is converted into an electrical signal to further process the information.

At present, direct photodetectors are mainly based on photoconductive or photovoltaic principles. The principle of photoconductivity mainly utilizes the characteristics of the conductance change of a semiconductor material under illumination, and its essence is that light causes changes in the concentration of electrons, holes, and other carriers in the semiconductor. After the carrier concentration changes, the conductivity of the semiconductor changes, and its resistance changes significantly. By detecting the change of the current flowing through the semiconductor before and after the illumination, the detection of the optical signal can be achieved. The photodetector based on the photoconductive principle may be a simple device structure of electrode/photoelectric response semiconductor/electrode and may also be a device structure that uses a photoelectric response semiconductor material as the active layer between the source and the drain of a field effect transistor. The photovoltaic principle uses the photovoltaic effect of the pn junction, which is similar to a solar cell. Through proper device design, by constructing a pn junction device based on a photoelectrically responsive semiconductor material and testing the output voltage change or current change of the device before and after illumination, the detection of the optical signal can also be achieved. In addition to direct photodetector technology, there are also indirect photoelectric detection technologies, such as thermal detectors. That is, the thermal effect of the optical signal is used to change the temperature of the detection element, and the change of the physical properties of the detection element caused by the temperature change is further measured, so optical detection is thus achieved.

At present, although the development of the photodetector technology is mature, there are a series of problems to be solved urgently in the related art. For a photoconductive photodetector, the photoelectric response semiconductor material absorbs light to generate photogenerated carriers and transport the carriers simultaneously. One of the difficulties involved herein is that a semiconductor material with a good light-absorbing ability does not necessarily exhibit a good carrier transport ability. Another difficulty is that in order to obtain higher detection accuracy, the dark current caused by defect states in the active layer semiconductor must be as small as possible, which puts forward higher requirements for the semiconductor material. Therefore, the selection and preparation of semiconductors are considerably limited. For a photovoltaic photodetector, just like the problem faced by solar cells, the recombination inside the device limits the sensitivity and other performances of the device to a large extent. Limited by the working principle, photodetectors based on thermal effects also have sensitivity problems. Although many photodetectors with good performance have been obtained through changes in the working environment of the device and effective control of high-quality materials in the device, these technologies have significantly increased the costs of photodetectors. How to reduce the manufacturing costs of the device while improving the photoelectric detection capability of the device is still the focus of field development.

SUMMARY

The invention provides a dielectric layer response-based field effect transistor photodetector configured to achieve the flexible design and low-cost manufacturing of the high-performance photodetector.

The technical solutions provided by the disclosure to solve the foregoing technical problem are provided as follows. The invention provides a dielectric layer response-based field effect transistor photodetector including a gate, a photoelectric response composite dielectric layer, a carrier transport layer, a source, and a drain. The photoelectric response composite dielectric layer is formed by compounding photoelectric response dielectric and charge blocking insulating dielectric.

The carrier transport layer is used for transporting electrons or holes, the photoelectric response dielectric is used for absorbing light under illumination to generate electrons, holes, or excitons, and the charge blocking insulating dielectric is used for limiting passage of the electrons, holes, or excitons. The generation of photogenerated electrons, holes, or excitons in the photoelectric response composite dielectric layer and the movement of the photogenerated electrons, holes, or excitons limited within the photoelectric response dielectric cause an equivalent permittivity of the photoelectric response composite dielectric layer to change and further cause a change in carrier concentration and a change in conductivity of the carrier transport layer, and photoelectric detection is achieved according to a change in current between the source and the drain before and after illumination.

Beneficial effects provided by the invention include the following. In the dielectric layer response-based field effect transistor photodetector disclosed by the invention, the photoelectric response dielectric in the photoelectric response composite dielectric layer interacts with the optical signal, and the photoelectric response dielectric absorbs light to generate electrons, holes, excitons, etc. The charge blocking insulating dielectric in the photoelectric response composite dielectric layer limits the photogenerated electrons, holes, excitons, etc. within the photoelectric response dielectric. Under the action of the bias voltage applied between the source and the gate, the electrons, holes, and excitons move orientationally within the photoelectric response dielectric without forming a conductive path with an external circuit, which is equivalent to the change of the permittivity of the dielectric layer. The change of the permittivity of the dielectric layer directly leads to the change of the capacitance formed by the source, the dielectric layer, and the gate, which in turn causes the change of the carrier concentration in the carrier transport layer. When a bias voltage is given between the source and the drain, photoelectric detection can be achieved by detecting the current change and the like between the source and the drain. Therefore, in the dielectric layer response-based field effect transistor photodetector disclosed by the invention, the photoelectric response dielectric only needs to exhibit a good light-absorbing ability and does not need to exhibit good carrier-transporting properties. The carrier transport layer between the source and the drain only needs to exhibit a good carrier-transporting ability and a low defect state density and does not need to exhibit a good light-absorbing ability. The carrier transport layer and the photoelectric response dielectric in the photoelectric response composite dielectric layer undertake the functions of carrier transport and photoelectric response respectively. In this structural design, the flexibility of design of photoelectric detection devices is significantly improved, and implementation of a high-performance and low-cost photoelectric detection device may thus be further achieved.

Based on the foregoing technical solutions, the following improvements are also provided by the invention.

Further, the gate, the dielectric layer, and the carrier transport layer are stacked in sequence, and the source and the drain are spaced apart on a surface of the carrier transport layer.

Further, the gate and the dielectric layer are stacked, the source and the drain are spaced apart on a surface of the dielectric layer, and the carrier transport layer is disposed around the source and the drain.

Further, a structure of the photoelectric response composite dielectric layer is: a sandwich structure of a charge blocking insulating dielectric layer/a photoelectric response dielectric layer/a charge blocking insulating dielectric layer or a stacked structure formed by the sandwich structure.

Further, a structure of the photoelectric response composite dielectric layer is: a random dispersion structure of the photoelectric response dielectric clustering in the charge blocking insulating dielectric.

Further, a structure of the photoelectric response composite dielectric layer is: a combined structure of a sandwich structure and a random dispersion structure. The sandwich structure is a sandwich structure of a charge blocking insulating dielectric layer/a photoelectric response dielectric layer/a charge blocking insulating dielectric layer, and the random dispersion structure is a random dispersion structure of the photoelectric response dielectric clustering in the charge blocking insulating dielectric.

The beneficial effects provided by the invention further include the following. The photoelectric response composite dielectric layer and the carrier transport layer are arranged between the electrodes. Based on the above, to be specific, the arrangement position of the carrier transport layer and the internal structure of the composite dielectric layer can be designed in terms of material selection and process. Therefore, the device structure provided by the invention can be flexibly arranged according to actual needs.

Further, the photoelectric response dielectric is selected from the group consisting of silicon, germanium, and selenium elemental semiconductor materials, gallium arsenide GaAs, lead sulfide PbS, and bromine lead cesium $CsPbBr_3$ perovskite compound semiconductor materials, lead iodide methylamine $MAPbI_3$ perovskite, iodine tin formamidine $FASnI_3$ perovskite, and di-tetrabutylammonium-bis(isothiocyano)bis(2,2'-bipyridine-4,4'dicarboxy)ruthenium organic-inorganic hybrid materials, and fullerene and its derivatives, poly-3-hexylthiophene, anthracene, and triphenylamine organic materials.

Further, the charge blocking insulating dielectric is selected from the group consisting of silicon oxide, aluminum oxide, zirconia, polymethyl methacrylate, polystyrene, polyethylene glycol, and polyvinylpyrrolidone.

Further, the carrier transport layer is selected from the group consisting of silicon, gallium arsenide, gallium nitride, zinc oxide, halide perovskite, fullerene derivatives, polytriarylamine, and Spiro-MeOTAD.

Further, each of the gate, the source, and the drain is independently selected from the group consisting of metal materials, heavily doped and highly conductive semiconductor materials, and carbon materials.

DESCRIPTION OF THE EMBODIMENTS

In order to make the objectives, technical solutions, and advantages of the invention clearer and more comprehensible, the invention is further described in detail with reference to the drawings and embodiments. It should be understood that the specific embodiments described herein serve to explain the invention merely and are not used to limit the invention. In addition, the technical features involved in the various embodiments of the invention described below can be combined with each other as long as the technical features do not conflict with each other.

Embodiment One

Figure 1:
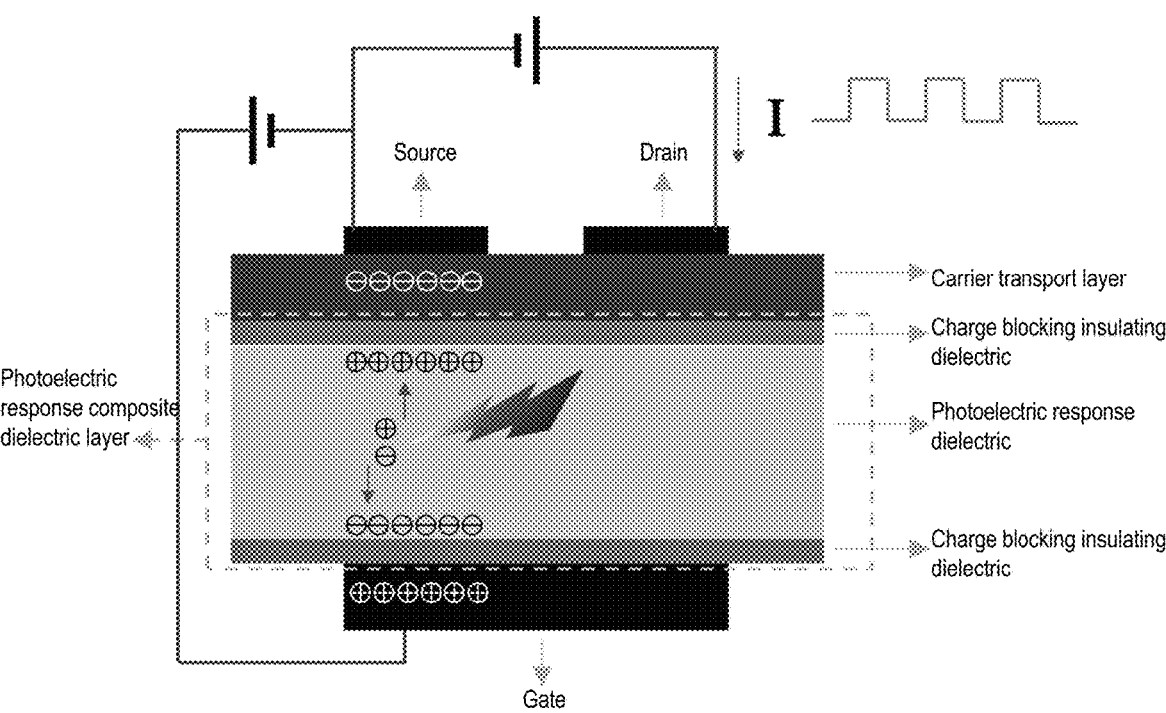
FIG. 1 is a schematic structural diagram of a dielectric layer response-based field effect transistor photodetector according to an embodiment of the invention.
Figure 1:
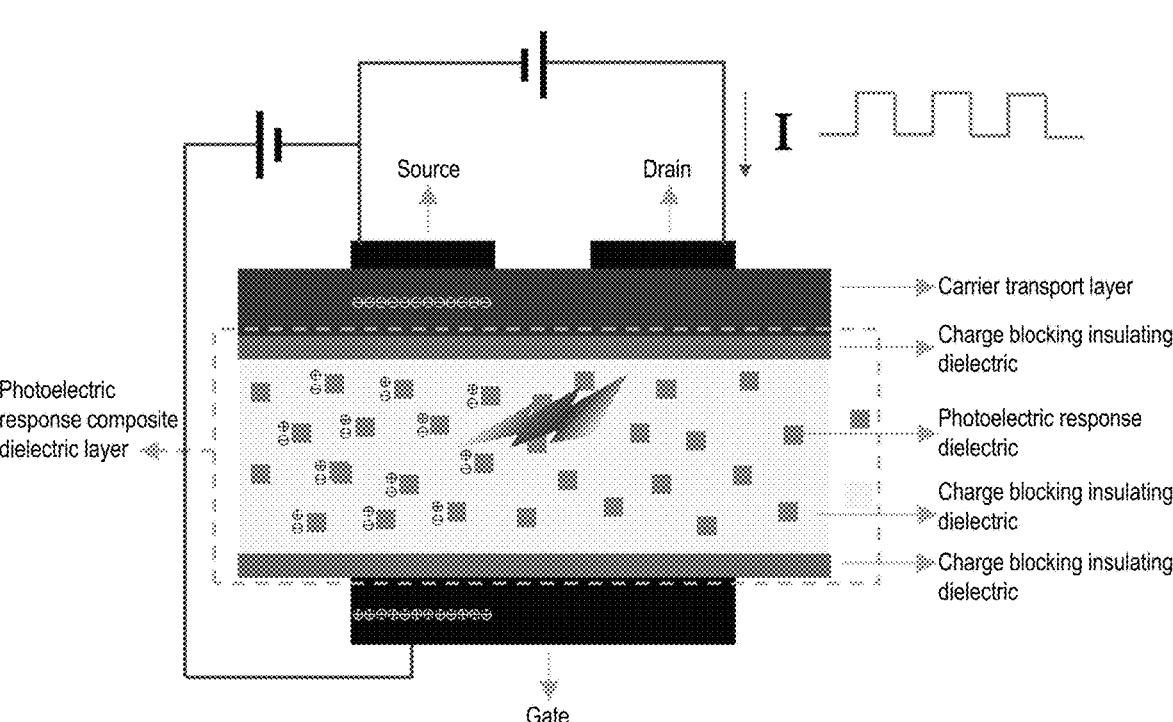

A dielectric layer response-based field effect transistor photodetector as shown in FIG. 1 includes a gate, a photoelectric response composite dielectric layer, a carrier transport layer, a source, and a drain. Herein, the photoelectric response composite dielectric layer is formed by compounding photoelectric response dielectric and charge blocking insulating dielectric.

The carrier transport layer is used for transporting electrons or holes, the photoelectric response dielectric is used for absorbing light under illumination to generate electrons, holes, or excitons, and the charge blocking insulating dielectric is used for limiting passage of the electrons, holes, or excitons. The generation of photogenerated electrons, holes, or excitons in the photoelectric response composite dielectric layer and the movement of the photogenerated electrons, holes, or excitons limited within the photoelectric response dielectric cause an equivalent permittivity of the photoelectric response composite dielectric layer to change and further cause a change in carrier concentration and a change in conductivity of the carrier transport layer, and photoelectric detection is achieved according to a change in current between the source and the drain before and after illumination.

A field effect transistor is generally considered to be a voltage-modulated semiconductor device, and by adjusting a voltage between the source and the gate, the regulation of the current between the source and the drain can be achieved. Its basic working principle can be simply understood as the source, the dielectric layer, and the gate in the device form a capacitor. When a voltage is applied between the source and the drain, according to the basic properties of a capacitor, charge accumulation may occur near the source and the drain, and the type of accumulated charges is related to the direction of the voltage. For instance, when the source potential is higher than the gate, positive charges may accumulate near the source, and when the source potential is lower than the gate, negative charges may accumulate near the source. The amount of accumulated charges is directly related to the magnitude of the voltage applied between the source and the gate. The source directly contacts the carrier transport layer. When charge accumulation occurs near the source, this part of the charges may directly lead to a change in the carrier concentration in the carrier transport layer. Simply put, when the carrier transport layer is an intrinsic semiconductor, or where the majority carriers are electrons, and negative charges are accumulated near the source, the carrier concentration in the carrier transport layer may increase, and the conductivity of the carrier transport layer increases accordingly. When a voltage is given between the source and the drain, the current between the source and the drain may increase accordingly. In this case, increasing the voltage between the source and the gate within a certain range may further increase the amount of charges accumulated near the source, so that the carrier concentration and conductivity of the carrier transport layer may increase, and the current between the source and the drain may also increase. When the majority of carriers in the carrier transport layer are holes and negative charges accumulate near the source, within a certain range (no inversion layer is formed), the carrier concentration in the carrier transport layer may decrease, and the conductivity of the carrier transport layer decreases accordingly. When a voltage is given between the source and the drain, the current between the source and the drain may decrease accordingly. In this case, increasing the voltage difference between the source and the gate within a certain range may further increase the negative charges accumulated near the source, so that the carrier concentration and conductivity in the carrier transport layer may decrease, and the current between the source and the drain may accordingly decrease. Similar basics are also applied in other cases. It can be seen from herein that the current between the source and the drain can be regulated by the voltage between the source and the gate. Regulating the current between the source and the drain of the field effect transistor by adjusting the voltage between the source and the gate is the basic working state of the field effect transistor.

It can be seen from the above analysis that in the field effect transistor, regulating the amount of charges accumulated near the source is the key to regulate the carrier concentration and conductivity in the carrier transport layer, and thus is the basis for regulating the current between the source and the drain. From the basic principle, the amount of charges accumulated near the source is not only directly related to the magnitude of the voltage applied between the source and the gate, but also directly related to the capacitance formed by the source, the dielectric layer, and the gate. This increase or decrease in capacitance also results in an increase or decrease in the charges accumulated near the source. In this embodiment, a composite dielectric layer with a photoelectric response capability is disclosed, which is used in field effect light to form a field effect transistor photodetector. In the device, the photoelectric response dielectric in the composite dielectric layer may absorb light to generate electrons, holes, or excitons. When a bias voltage is applied between the source and the gate, the electrons, holes, or excitons generated by the light absorption of the photoelectric response dielectric may orientationally move or shift, and there will be charge movement between the source and the gate. In this process, the charge blocking insulating dielectric in the composite dielectric layer may limit the electrons, holes, or excitons generated by the light absorption of the photoelectric response dielectric within a film layer or within clusters of the photoelectric response dielectric. Charges moving between the source and the gate are accumulated at an interface between the source and the composite dielectric layer or the gate and the composite dielectric layer, etc., resulting in an increase in the amount of accumulated charges near the source. That is, in this process, due to the presence of the charge blocking insulating dielectric in the composite dielectric layer, the electrons, holes, or excitons generated by the light absorption of the photoelectric response dielectric do not form a conductive path with the source and the gate to form a continuous current, but only lead to the accumulation of charges at the source and the gate, which is equivalent to an increase in a permittivity of the composite dielectric layer. In short, regarding the dielectric layer response-based field effect transistor photodetector provided by this embodiment, after illumination, the composite dielectric layer absorbs light to generate electrons, holes, or excitons, which leads to an increase in an equivalent permittivity of the composite dielectric layer. This increased permittivity results in an increase in the capacitance formed by the source, the composite dielectric layer, and the gate. When a voltage is given provided between the source and the gate, this increased capacitance directly results in an increase in the amount of accumulated charges near the source and causes a change in the carrier concentration and a change in the conductivity in the carrier transport layer. When a voltage is given between the source and the drain, the change in the conductivity of the carrier transport layer directly cause the current between the source and the drain to change, and the function of photoelectric detection is thereby achieved.

This embodiment aims to develop a high-performance photodetector to solve the problems faced by the photodetector technology provided by the related art. The working principle of the dielectric layer response-based field effect transistor photodetector disclosed in this embodiment is different from that of the aforementioned photoconductive, photovoltaic, and photothermal photodetectors and the like. In the dielectric layer response-based field effect transistor photodetector disclosed by this embodiment, the carrier transport layer semiconductor between the source and the drain is only responsible for carrier transport, and does not need to interact with an optical signal to generate a photoresponse. Therefore, in the dielectric layer response-based field effect transistor photodetector disclosed by this embodiment, semiconductor materials with good carrier transport properties may be flexibly selected according to the application needs. In the dielectric layer response-based field effect transistor photodetector disclosed by this embodiment, the photoelectric response dielectric in the dielectric layer interacts with the optical signal, and the photoelectric response dielectric absorbs light to generate electrons, holes, excitons, etc. Under the action of the bias voltage applied between the source and the gate and under the blocking of the charge blocking insulating dielectric, the electrons, holes, or excitons generated in the composite dielectric layer only move orientationally in the photoelectric response dielectric. This leads to a change in the permittivity of the photoelectric response composite dielectric layer, which causes a change in the amount of charges accumulated near the source, which in turn causes changes in the carrier concentration and conductivity in the carrier transport layer. When a bias voltage is given between the source and the drain, the change in the conductivity of the carrier transport layer may cause the current between the source and the drain to change, and photoelectric detection is then achieved based on the change in the current between the source and the drain. It can be seen from herein that in the dielectric layer response-based field effect transistor photodetector disclosed by the invention, the photoelectric response dielectric only needs to exhibit a good light-absorbing ability and does not need to exhibit good carrier-transporting properties. Based on the above characteristics, it can be seen that in the dielectric layer response-based field effect transistor photodetector disclosed by the invention, the carrier transport layer between the source and the drain and the photoelectric response dielectric in the dielectric layer are respectively responsible for carrier transport and photoelectric response. In this structural design, the flexibility of design of photoelectric detection devices is significantly improved, and implementation of a high-performance and low-cost photoelectric detection device may thus be further achieved.

Figure 2:
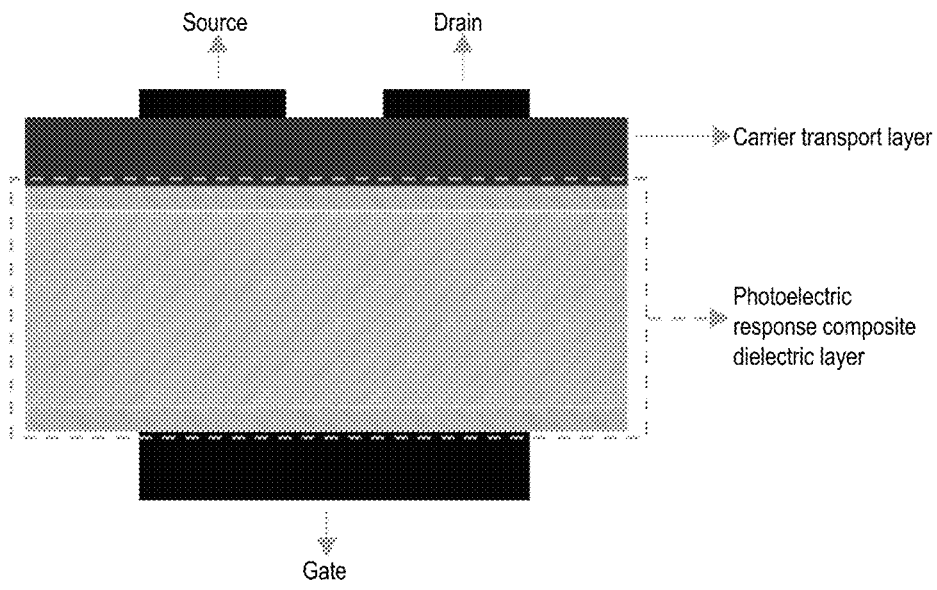
FIG. 2 is a schematic structural diagram of a dielectric layer response-based field effect transistor photodetector according to an embodiment of the invention.

Preferably, the gate, the dielectric layer, and the carrier transport layer are stacked in sequence, and the source and the drain are spaced apart on a surface of the carrier transport layer, as shown in FIG. 2.

Figure 3:
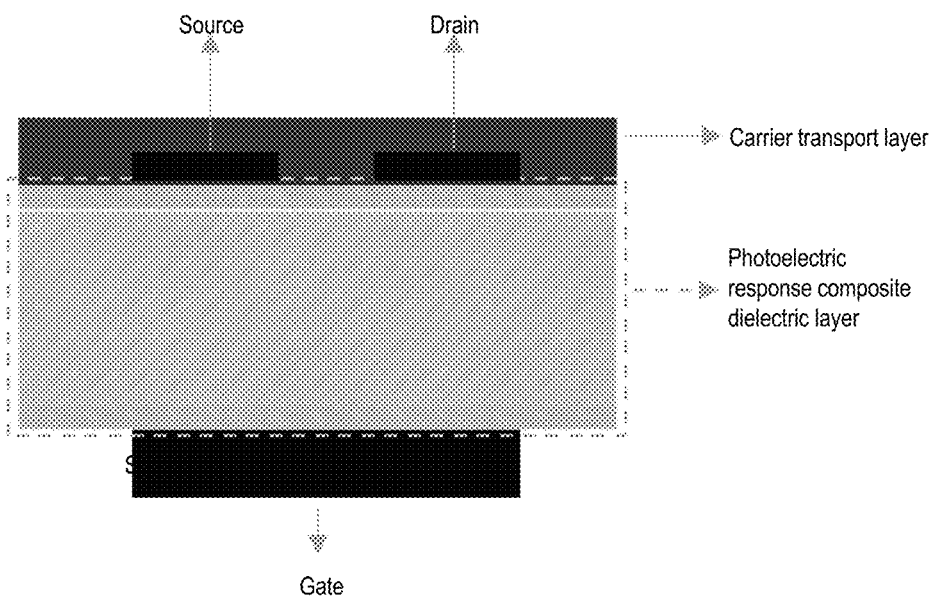
FIG. 3 is a schematic structural diagram of another dielectric layer response-based field effect transistor photodetector according to an embodiment of the invention.

Preferably, the gate and the dielectric layer are stacked, the source and the drain are spaced apart on a surface of the dielectric layer, and the carrier transport layer is disposed around the source and the drain, as shown in FIG. 3.

Figure 4:
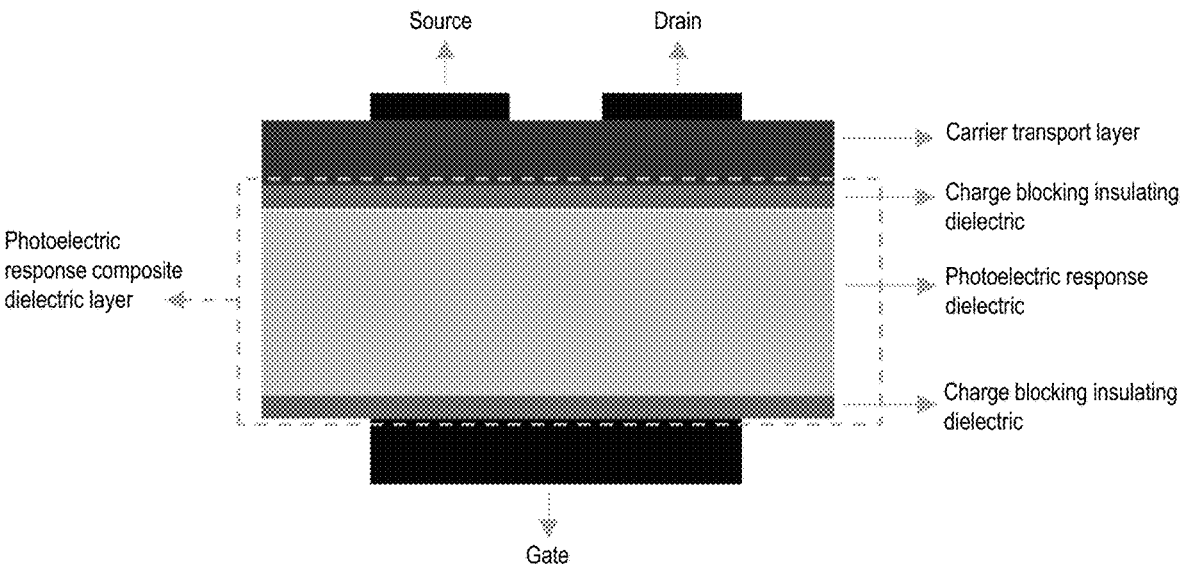
FIG. 4 is a schematic structural diagram of another dielectric layer response-based field effect transistor photodetector according to an embodiment of the invention.
Figure 5:
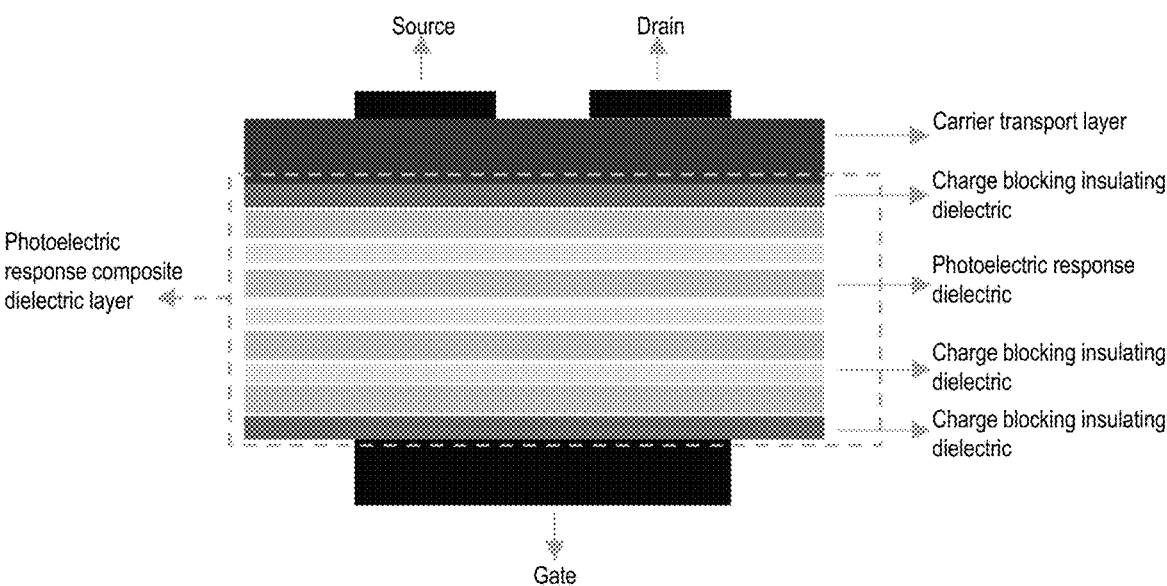
FIG. 5 is a schematic structural diagram of another dielectric layer response-based field effect transistor photodetector according to an embodiment of the invention.

Preferably, as shown in FIG. 4 and FIG. 5, a structure of the dielectric layer is: a sandwich structure of a charge blocking insulating dielectric layer/a photoelectric response dielectric layer/a charge blocking insulating dielectric layer or a stacked structure formed by the sandwich structure.

Figure 6:
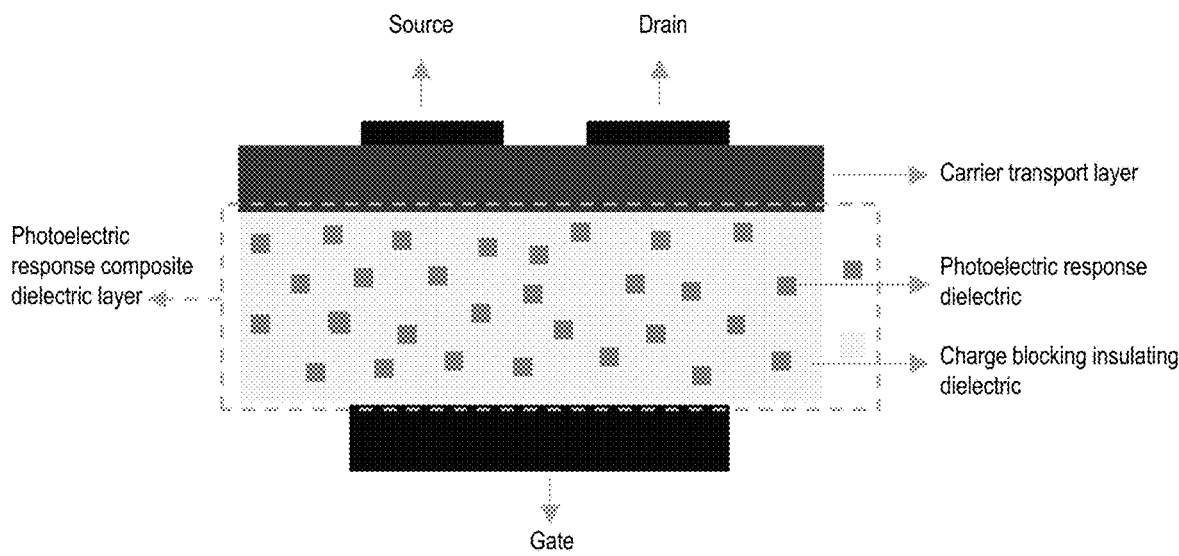
FIG. 6 is a schematic structural diagram of another dielectric layer response-based field effect transistor photodetector according to an embodiment of the invention.

Preferably, as shown in FIG. 6, the structure of the dielectric layer is: a random dispersion structure of photoelectric response dielectric clustering in the charge blocking insulating dielectric.

Figure 7:
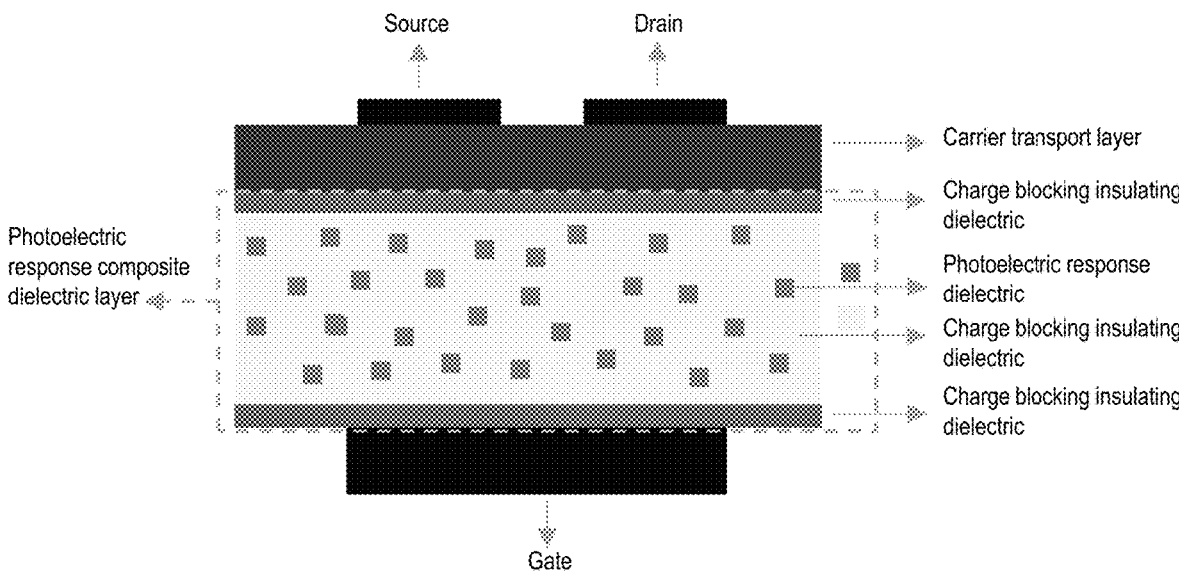
FIG. 7 is a schematic structural diagram of another dielectric layer response-based field effect transistor photodetector according to an embodiment of the invention.

Preferably, as shown in FIG. 7, the structure of the dielectric layer is: a combined structure of the sandwich structure and the random dispersion structure. Herein, the sandwich structure is a sandwich structure of a charge blocking insulating dielectric layer/a photoelectric response dielectric layer/a charge blocking insulating dielectric layer, and the random dispersion structure is a random dispersion structure of the photoelectric response dielectric clustering in the charge blocking insulating dielectric.

Compared with the photoconductive, photovoltaic, and photothermal photodetectors and the like provided by the related art, the dielectric layer response-based field effect transistor photodetector of this embodiment is obviously different in terms of device structure and working principle. Compared with the photoconductive effect-based field effect photodetector provided by the related art, the dielectric layer response-based field effect transistor photodetector of this embodiment also exhibits obvious differences, and these differences bring advantages of flexible design and regulation of the devices. To be specific, in the photoconductive effect-based field effect photodetector, the carrier transport layer thereof needs to meet a series of requirements such as a good light-absorbing ability, a good carrier-transporting ability, and few defect states at the same time, which limits the choice of device materials to a large extent. An easily conceivable problem is that some materials have good light absorption properties, but the carrier mobility thereof is low or there are many defect states, so the sensitivity of the manufactured photodetector is directly limited. Some materials have good carrier mobility and few defect states, but exhibit limited light-absorbing ability and cannot effectively interact with light, so the practicability of the manufactured photodetector is directly limited. In the dielectric layer response-based field effect transistor photodetector provided by this embodiment, materials with high mobility, few defect states, and limited light-absorbing ability can be used as the carrier transport layer, and materials with strong light-absorbing ability and limited charge-transporting ability are used as the photoelectric response dielectric in the composite dielectric layer. Effective photoelectric detection is achieved in this way. For example, some small molecule light-absorbing materials have high light-absorbing ability, but after light absorption, excitons are generated instead of free carriers. These small molecules are difficult to use in a photoconductive effect-based field effect transistor photodetector, but flexible in a dielectric layer response-based field effect transistor. The dielectric layer response-based field effect transistor photodetector not only has direct advantages in device design and material selection, but also has a series of potential advantages in device performance. On the one hand, the photoelectric response dielectric of the photoconductive effect-based field effect transistor photodetector is the material of the carrier transport layer itself, which is generally single. However, in the dielectric layer response-based field effect transistor photodetector of this embodiment, the photoelectric response dielectric can be flexibly matched according to usage needs. For instance, in a multi-layered stack structure, different photoelectric response dielectric layers may use different photoelectric response materials. Alternatively, photoelectric response dielectric clusters with different photoelectric response properties are used in the photoelectric response dielectric clusters/a charge blocking insulating dielectric composite. In this way, the selection and expansion of a photoresponse wavelength may be achieved by combining the photoelectric response properties of these photoelectric response dielectrics. On the other hand, in a photoconductive response-based field effect transistor photodetector provided by the related art, the carrier transport layer with the light-absorbing ability is limited by its own crystallinity, and there are many defect states in many cases. The presence of these defect states leads to a large dark current between the source and drain, which restricts the sensitivity of the device. In the dielectric layer response-based field effect transistor photodetector of this embodiment, since the carrier transport layer does not need to absorb light, materials with high crystallinity and few defects may be selected as the carrier transport layer. The generation of dark current is thereby suppressed, and the sensitivity of the device is improved in this way. Further, in a photoconductive effect-based field effect transistor photodetector provided by the related art, after the carrier transport layer absorbs light, the generation, transport, and recombination rates of carriers directly affect the time-scale sensitivity of the photodetector. However, in the dielectric layer response-based photodetector of this embodiment, the carrier transport layer does not need to generate photogenerated carriers. The time resolution of the device is significantly related to the light absorption of the photoelectric response dielectric in the composite dielectric layer to generate electrons, holes, or excitons as well as the recombination behavior of the electrons, holes, and excitons. By choosing a material system with strong light-absorbing ability and rapid carrier generation and disappearance without considering the limitation of its carrier transport, such as the use of organic molecules or nanocrystals, the photoelectric response time-resolution characteristics of the dielectric layer response-based field effect transistor photodetector can be effectively regulated. In addition, through the flexible combination of the charge blocking insulating dielectric and the photoelectric response dielectric, the size control of some dimensions of the photoelectric response dielectric may be achieved. In this way, the photoelectric response dielectric has quantum effects to a certain extent, the photoelectric response properties are thus affected, and the photoelectric detection capability of the corresponding device is regulated. Obviously, due to the direct difference in the working principle of the device, the dielectric layer response-based field effect transistor photodetector exhibits a series of advantages in performance, not limited to the above advantages.

Preferably, in the dielectric layer formed by compounding the photoelectric response dielectric and the charge blocking insulating dielectric, the photoelectric response dielectric is formed by materials that can absorb light to generate photoelectric response behaviors such as electrons, holes, and excitons, and are preferably silicon, germanium, and selenium elemental semiconductor materials and the like, gallium arsenide GaAs, lead sulfide PbS, and bromine lead cesium $CsPbBr_3$ perovskite compound semiconductor materials and the like, lead iodide methylamine $MAPbI_3$ perovskite, iodine tin formamidine $FASnI_3$ perovskite, and di-tetrabutylammonium-bis(isothiocyano)bis(2,2'-bipyridine-4, 4'dicarboxy)ruthenium organic-inorganic hybrid materials and the like, and fullerene and its derivatives, poly-3-hexylthiophene, anthracene, and triphenylamine organic materials and the like.

Preferably, in the dielectric layer formed by compounding the photoelectric response dielectric and the charge blocking insulating dielectric, the charge blocking insulating dielectric is formed by a poor conductor of electrons and holes, preferably silicon oxide, aluminum oxide, zirconia, polymethyl methacrylate, polystyrene, polyethylene glycol, and polyvinylpyrrolidone and the like.

Preferably, the carrier transport layer is formed by a semiconductor material with carrier transport capability, preferably silicon, gallium arsenide, gallium nitride, zinc oxide, halide perovskite, fullerene derivatives, polytriarylamine, and Spiro-MeOTAD and the like.

Preferably, each of the gate, the source, and the drain is independently formed by a metal material such as gold and aluminum, a highly conductive semiconductor material such as tin-doped indium oxide and heavily doped silicon, or a carbon material such as graphene.

In order to clearly illustrate the disclosure, examples are provided as follows.

Example One

Figure 8:
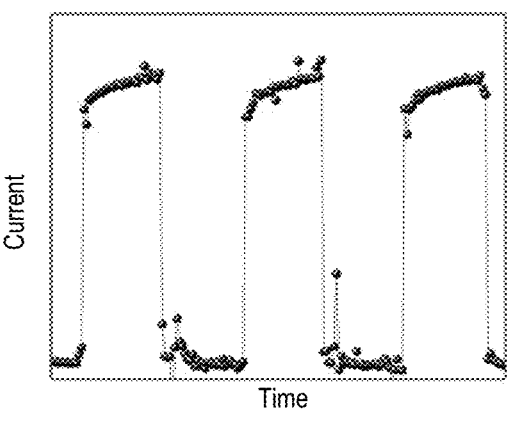
FIG. 8 is a chart of photoelectric response properties of the field effect transistor photodetector provided by an embodiment of the invention.

Tin-doped indium oxide transparent conductive glass was treated as the gate. A 20 nm polymethyl methacrylate film was prepared by spin coating on it, which was treated as the charge blocking insulating dielectric. A 100 nm layer of $FASnI_3$ halide perovskite was deposited on a polymethyl methacrylate film to be treated as the photoelectric response dielectric. A 10 nm aluminum oxide film was deposited on the $FASnI_3$ film by atomic deposition technology as the charge blocking insulating dielectric. Spiro-OMeTAD film was prepared by spin coating on it, which was treated as the carrier transport layer. The metal source and drain were evaporated on the Spiro-OMeTAD film. Bias voltages were applied between the source and the gate and the drain, and 800 nm light was applied to the device, and the change of the current between the source and the drain before and after the illumination was tested as shown in FIG. 8. Before and after the application and removal of light, the current between the source and the drain in the device changed significantly, and the device exhibited photoelectric response properties.

Example Two

Figure 9:
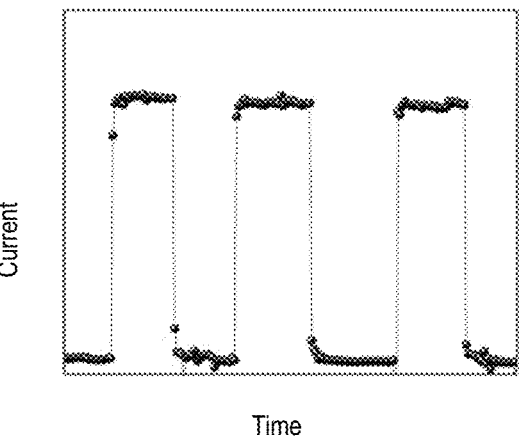
FIG. 9 is a chart of photoelectric response properties of another field effect transistor photodetector provided by an embodiment of the invention.

An aluminum oxide substrate deposited with gallium nitride was used, and gallium nitride was used as the carrier transport layer. An aluminum electrode was deposited on it as the source and the drain. 10 nm of aluminum oxide was deposited on the carrier transport layer as the charge blocking insulating dielectric. Subsequently, 40 nm of selenium was deposited as the photoelectric response dielectric and 10 nm of alumina as the charge blocking insulating dielectric were deposited sequentially, and repeated three times. Subsequently, an aluminum electrode was deposited for use as the gate. Bias voltages were applied between the source and the gate and the drain, and 500 nm light was applied to the device, and the change of the current between the source and the drain before and after the illumination was tested as shown in FIG. 9. Before and after the application and removal of light, the current between the source and the drain in the device changed significantly, and the device exhibited photoelectric response properties.

Example Three

Figure 10:
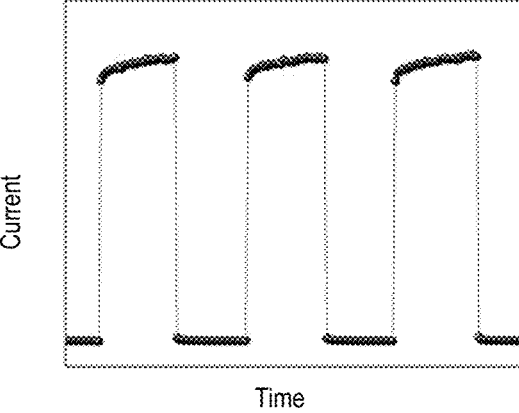
FIG. 10 is a chart of photoelectric response properties of another field effect transistor photodetector provided by an embodiment of the invention.

Tin-doped indium oxide transparent conductive glass was used, and the source and the gate were formed by laser etching. A MAPbI₃ halide perovskite layer was deposited on it as the carrier transport layer. Subsequently, 10 nm of alumina was deposited as the charge blocking insulating dielectric. The dispersion of lead sulfide nanocrystals and polystyrene in ethylene glycol butyl acetate was spin-coated on alumina to prepare a 100 nm thin film (random dispersion structure). Subsequently, 10 nm of alumina was deposited as the charge blocking insulating dielectric. An aluminum electrode was then deposited to serve as the gate. Bias voltages were applied between the source and the gate and the drain, and 950 nm light was applied to the device, and the change of the current between the source and the drain before and after the illumination was tested as shown in FIG. 10. Before and after the application and removal of light, the current between the source and the drain in the device changed significantly, and the device exhibited photoelectric response properties.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A dielectric layer response-based field effect transistor photodetector, comprising:

a gate, a photoelectric response composite dielectric layer, a carrier transport layer, a source, and a drain, wherein the photoelectric response composite dielectric layer is formed by compounding photoelectric response dielectric and charge blocking insulating dielectric, wherein the photoelectric response dielectric is used for absorbing light under illumination to generate electrons, holes, or excitons, the charge blocking insulating dielectric is used for limiting passage of the electrons, holes, and excitons, a structure of the photoelectric response composite dielectric layer satisfies the following:

the charge blocking insulating dielectric confines the electrons, holes, and excitons within the photoelectric response dielectric, thereby preventing the electrons, holes, and excitons from leaving the photoelectric response composite dielectric layer, and further preventing the electrons, holes, and excitons from entering other components of the field effect transistor photodetector, and the carrier transport layer is used for transporting electrons or holes, the generation of photogenerated electrons, holes, or excitons in the photoelectric response composite dielectric layer and the movement of the photogenerated electrons, holes, or excitons limited within the photoelectric response dielectric cause an equivalent permittivity of the photoelectric response composite dielectric layer to change, so as to cause a change in carrier concentration and a change in conductivity of the carrier transport layer, and photoelectric detection is achieved according to a change in current between the source and the drain before and after illumination.

2. The dielectric layer response-based field effect transistor photodetector according to claim 1, wherein the gate, the photoelectric response composite dielectric layer, and the carrier transport layer are stacked in sequence, and the source and the drain are spaced apart on a surface of the carrier transport layer.

3. The dielectric layer response-based field effect transistor photodetector according to claim 1, wherein the gate and the dielectric layer are stacked, the source and the drain are spaced apart on a surface of the dielectric layer, and the carrier transport layer is disposed around the source and the drain.

4. The dielectric layer response-based field effect transistor photodetector according to claim 1, wherein a structure of the photoelectric response composite dielectric layer is:

a sandwich structure of a charge blocking insulating dielectric layer/a photoelectric response dielectric layer/a charge blocking insulating dielectric layer or a stacked structure formed by the sandwich structure.

5. The dielectric layer response-based field effect transistor photodetector according to claim 1, wherein a structure of the photoelectric response composite dielectric layer is:

a random dispersion structure of the photoelectric response dielectric clustering in the charge blocking insulating dielectric.

6. The dielectric layer response-based field effect transistor photodetector according to claim 1, wherein a structure of the photoelectric response composite dielectric layer is:

a combined structure of a sandwich structure and a random dispersion structure, wherein the sandwich structure is a sandwich structure of a charge blocking insulating dielectric layer/a photoelectric response dielectric layer/a charge blocking insulating dielectric layer, and the random dispersion structure is a random dispersion structure of the photoelectric response dielectric clustering in the charge blocking insulating dielectric.

7. The dielectric layer response-based field effect transistor photodetector according to claim 1, wherein the photoelectric response dielectric is selected from the group consisting of silicon, germanium, and selenium elemental semiconductor materials, gallium arsenide GaAs, lead sulfide PbS, and bromine lead cesium CsPbBr3 perovskite compound semiconductor materials, lead iodide methylamine MAPbI3 perovskite, iodine tin formamidine FASnI3 perovskite, and di-tetrabutylammonium-bis(isothiocyano)bis(2,2'-bipyridine-4,4'dicarboxy) ruthenium organic-inorganic hybrid materials, and fullerene and its derivatives, poly-3-hexylthiophene, anthracene, and triphenylamine organic materials.

8. The dielectric layer response-based field effect transistor photodetector according to claim 1, wherein the charge blocking insulating dielectric is selected from the group consisting of silicon oxide, aluminum oxide, zirconia, polymethyl methacrylate, polystyrene, polyethylene glycol, and polyvinylpyrrolidone.

9. The dielectric layer response-based field effect transistor photodetector according to claim 1, wherein the carrier transport layer is selected from the group consisting of silicon, gallium arsenide, gallium nitride, zinc oxide, halide perovskite, fullerene derivatives, polytriarylamine, and Spiro-MeOTAD.

10. The dielectric layer response-based field effect transistor photodetector according to claim 1, wherein each of the gate, the source, and the drain is independently selected from the group consisting of metal materials, heavily doped and highly conductive semiconductor materials, and carbon materials.

11. The dielectric layer response-based field effect transistor photodetector according to claim 2, wherein the photoelectric response dielectric is selected from the group consisting of silicon, germanium, and selenium elemental semiconductor materials, gallium arsenide GaAs, lead sulfide PbS, and bromine lead cesium CsPbBr3 perovskite compound semiconductor materials, lead iodide methylamine MAPbI3 perovskite, iodine tin formamidine FASnI3 perovskite, and di-tetrabutylammonium-bis(isothiocyano)bis(2,2'-bipyridine-4,4'dicarboxy) ruthenium organic-inorganic hybrid materials, and fullerene and its derivatives, poly-3-hexylthiophene, anthracene, and triphenylamine organic materials.

12. The dielectric layer response-based field effect transistor photodetector according to claim 2, wherein the charge blocking insulating dielectric is selected from the group consisting of silicon oxide, aluminum oxide, zirconia, polymethyl methacrylate, polystyrene, polyethylene glycol, and polyvinylpyrrolidone.

13. The dielectric layer response-based field effect transistor photodetector according to claim 2, wherein the carrier transport layer is selected from the group consisting of silicon, gallium arsenide, gallium nitride, zinc oxide, halide perovskite, fullerene derivatives, polytriarylamine, and Spiro-MeOTAD.

14. The dielectric layer response-based field effect transistor photodetector according to claim 2, wherein each of the gate, the source, and the drain is independently selected from the group consisting of metal materials, heavily doped and highly conductive semiconductor materials, and carbon materials.

15. The dielectric layer response-based field effect transistor photodetector according to claim 3, wherein the photoelectric response dielectric is selected from the group consisting of silicon, germanium, and selenium elemental semiconductor materials, gallium arsenide GaAs, lead sulfide PbS, and bromine lead cesium CsPbBr3 perovskite compound semiconductor materials, lead iodide methylamine MAPbI3 perovskite, iodine tin formamidine FASnI3 perovskite, and di-tetrabutylammonium-bis(isothiocyano)bis(2,2'-bipyridine-4,4'dicarboxy) ruthenium organic-inorganic hybrid materials, and fullerene and its derivatives, poly-3-hexylthiophene, anthracene, and triphenylamine organic materials.

16. The dielectric layer response-based field effect transistor photodetector according to claim 3, wherein the charge blocking insulating dielectric is selected from the group consisting of silicon oxide, aluminum oxide, zirconia, polymethyl methacrylate, polystyrene, polyethylene glycol, and polyvinylpyrrolidone.

17. The dielectric layer response-based field effect transistor photodetector according to claim 3, wherein the carrier transport layer is selected from the group consisting of silicon, gallium arsenide, gallium nitride, zinc oxide, halide perovskite, fullerene derivatives, polytriarylamine, and Spiro-MeOTAD.

18. The dielectric layer response-based field effect transistor photodetector according to claim 3, wherein each of the gate, the source, and the drain is independently selected from the group consisting of metal materials, heavily doped and highly conductive semiconductor materials, and carbon materials.

19. The dielectric layer response-based field effect transistor photodetector according to claim 4, wherein the photoelectric response dielectric is selected from the group consisting of silicon, germanium, and selenium elemental semiconductor materials, gallium arsenide GaAs, lead sulfide PbS, and bromine lead cesium CsPbBr3 perovskite compound semiconductor materials, lead iodide methylamine MAPbI3 perovskite, iodine tin formamidine FASnI3 perovskite, and di-tetrabutylammonium-bis(isothiocyano)bis(2,2'-bipyridine-4,4'dicarboxy) ruthenium organic-inorganic hybrid materials, and fullerene and its derivatives, poly-3-hexylthiophene, anthracene, and triphenylamine organic materials.

20. The dielectric layer response-based field effect transistor photodetector according to claim 4, wherein the charge blocking insulating dielectric is selected from the group consisting of silicon oxide, aluminum oxide, zirconia, polymethyl methacrylate, polystyrene, polyethylene glycol, and polyvinylpyrrolidone.

* * * * *